US012640184B2

(12) United States Patent
    Song

(10) Patent No.:    US 12,640,184 B2
(45) Date of Patent:        May 26, 2026

(54) BUFFER CHIP, SEMICONDUCTOR PACKAGE INCLUDING BUFFER CHIP AND MEMORY CHIP, AND MEMORY MODULE

(71) Applicant: SK hynix Inc., Icheon-si (KR)

(72) Inventor: Choung Ki Song, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 228 days.

(21) Appl. No.: 18/507,901

(22) Filed: Nov. 13, 2023

(65) Prior Publication Data

US 2024/0312509 A1     Sep. 19, 2024

(30) Foreign Application Priority Data

Mar. 14, 2023   (KR) ........................ 10-2023-0032911
Aug. 3, 2023    (KR) ........................ 10-2023-0101718

(51) Int. Cl.
    *G11C 7/10*        (2006.01)
    *G11C 11/4072*     (2006.01)
    *G11C 11/4076*     (2006.01)
    *G11C 11/408*      (2006.01)
    *G11C 11/4093*     (2006.01)
    *H10B 80/00*       (2023.01)
    *H10W 90/00*       (2026.01)

(52) U.S. Cl.
    CPC ...... *G11C 11/4072* (2013.01); *G11C 11/4076* (2013.01); *G11C 11/4082* (2013.01); *G11C 11/4093* (2013.01); *H10B 80/00* (2023.02); *H10W 90/00* (2026.01); *H10W 90/754* (2026.01)

(58) Field of Classification Search
    CPC ............ G11C 11/4072; G11C 11/4076; G11C 11/4082; G11C 11/4093; H10B 80/00;
H01L 24/48; H01L 25/18; H01L
2224/48091; H01L 2224/48227

USPC ..................................................... 365/189.05
See application file for complete search history.

(56) References Cited

U.S. PATENT DOCUMENTS

| | | | |
|---|---|---|---|
| 5,754,764 A | 5/1998 | Davis et al. | |
| 7,177,211 B2 | 2/2007 | Zimmerman | |
| 7,379,361 B2 | 5/2008 | Co et al. | |
| 7,487,428 B2 | 2/2009 | Co et al. | |
| 8,275,936 B1 * | 9/2012 | Haywood ........... | G06F 13/1657 |
| | | | 365/189.05 |
| 8,447,908 B2 | 5/2013 | Bruce et al. | |
| 9,264,368 B2 | 2/2016 | Swarbrick et al. | |
| 10,083,728 B2 | 9/2018 | Luo et al. | |
| 10,522,209 B2 * | 12/2019 | Benedict ................ | G11C 5/025 |
| 10,713,137 B2 * | 7/2020 | Kim ................... | G11C 29/4401 |
| 11,599,430 B2 * | 3/2023 | Bradshaw ............. | G06F 1/3225 |

(Continued)

FOREIGN PATENT DOCUMENTS

DE      102007009817 B4     8/2012

*Primary Examiner* — Viet Q Nguyen
(74) *Attorney, Agent, or Firm* — WILLIAM PARK AND ASSOCIATES LTD.

(57)         ABSTRACT

A buffer chip may include: a chip select signal reception circuit configured to receive system chip select signals transmitted from a memory controller; a chip select signal mapping circuit configured to generate memory chip select signals by mapping the system chip select signals by using failed memory chip information; and a chip select signal transmission circuit configured to transmit the memory chip select signals to a plurality of memory chips.

18 Claims, 13 Drawing Sheets

(56) References Cited

U.S. PATENT DOCUMENTS

| | | | | |
|---|---|---|---|---|
| 12,009,023 B2 * | 6/2024 | Wu | .................. | G11C 29/021 |
| 12,198,784 B2 * | 1/2025 | You | .................. | G06F 13/1673 |
| 12,405,748 B2 | 9/2025 | Lee | | |
| 2005/0224948 A1 | 10/2005 | Lee et al. | | |
| 2007/0201256 A1 | 8/2007 | RaghuRam | | |
| 2008/0025137 A1 * | 1/2008 | Rajan | .................. | G11C 29/02 |
| | | | | 365/239 |
| 2009/0216939 A1 * | 8/2009 | Smith | ............. | G06F 13/4239 |
| | | | | 711/E12.083 |
| 2014/0181392 A1 * | 6/2014 | Malladi | ............. | G11C 29/028 |
| | | | | 711/105 |
| 2014/0189215 A1 * | 7/2014 | Kang | ............. | G11C 11/40603 |
| | | | | 711/106 |
| 2014/0192583 A1 * | 7/2014 | Rajan | .................. | G11C 7/10 |
| | | | | 365/63 |
| 2015/0363287 A1 * | 12/2015 | Dell | .................. | G06F 11/1076 |
| | | | | 714/6.3 |
| 2016/0147623 A1 * | 5/2016 | Ping | .................. | G06F 11/1016 |
| | | | | 714/6.13 |
| 2017/0212848 A1 | 7/2017 | Sun et al. | | |
| 2017/0277463 A1 | 9/2017 | Yoon | | |
| 2018/0166105 A1 | 6/2018 | Choi et al. | | |
| 2019/0171359 A1 | 6/2019 | Lee et al. | | |
| 2019/0237152 A1 | 8/2019 | Lee et al. | | |
| 2019/0362804 A1 | 11/2019 | Kim | | |
| 2021/0397570 A1 | 12/2021 | Ware et al. | | |
| 2021/0407567 A1 | 12/2021 | Kim | | |
| 2022/0238146 A1 | 7/2022 | Woo et al. | | |
| 2023/0072674 A1 | 3/2023 | Vogelsang et al. | | |
| 2023/0152840 A1 | 5/2023 | Zhang et al. | | |
| 2024/0055068 A1 | 2/2024 | Bamdhamravuri et al. | | |
| 2024/0094762 A1 | 3/2024 | Zhang et al. | | |
| 2024/0144984 A1 | 5/2024 | Morishita | | |
| 2024/0194227 A1 | 6/2024 | Wu et al. | | |
| 2024/0249767 A1 | 7/2024 | Song | | |
| 2024/0264947 A1 | 8/2024 | Kim | | |
| 2024/0321831 A1 | 9/2024 | Shin et al. | | |
| 2024/0420790 A1 | 12/2024 | Taylor et al. | | |

* cited by examiner

| | MEM0 | MEM1 | MEM2 | MEM3 | M_CS<0> | M_CS<1> | M_CS<2> | M_CS<3> |
|---|---|---|---|---|---|---|---|---|
| CASE0 | Pass, FMEM<0>=0 | Pass, FMEM<1>=0 | Pass, FMEM<2>=0 | Pass, FMEM<3>=0 | CS<0> | CS<1> | CS<2> | CS<3> |
| CASE1 | Fail, FMEM<0>=1 | Pass, FMEM<1>=0 | Pass, FMEM<2>=0 | Pass, FMEM<3>=0 | 1 | CS<0> | CS<1> | CS<2> |
| CASE2 | Pass, FMEM<0>=0 | Fail, FMEM<1>=1 | Pass, FMEM<2>=0 | Pass, FMEM<3>=0 | CS<0> | 1 | CS<1> | CS<2> |
| CASE3 | Fail, FMEM<0>=1 | Fail, FMEM<1>=1 | Pass, FMEM<2>=0 | Pass, FMEM<3>=0 | 1 | 1 | CS<0> | CS<1> |
| CASE4 | Pass, FMEM<0>=0 | Pass, FMEM<1>=0 | Fail, FMEM<2>=1 | Pass, FMEM<3>=0 | CS<0> | CS<1> | 1 | CS<2> |
| CASE5 | Fail, FMEM<0>=1 | Pass, FMEM<1>=0 | Fail, FMEM<2>=1 | Pass, FMEM<3>=0 | 1 | CS<0> | 1 | CS<1> |
| CASE6 | Pass, FMEM<0>=0 | Fail, FMEM<1>=1 | Fail, FMEM<2>=1 | Pass, FMEM<3>=0 | CS<0> | 1 | 1 | CS<1> |
| CASE7 | Fail, FMEM<0>=1 | Fail, FMEM<1>=1 | Fail, FMEM<2>=1 | Pass, FMEM<3>=0 | 1 | 1 | 1 | CS<0> |
| CASE8 | Pass, FMEM<0>=0 | Pass, FMEM<1>=0 | Pass, FMEM<2>=0 | Fail, FMEM<3>=1 | CS<0> | CS<1> | CS<2> | 1 |
| CASE9 | Fail, FMEM<0>=1 | Pass, FMEM<1>=0 | Pass, FMEM<2>=0 | Fail, FMEM<3>=1 | 1 | CS<0> | CS<1> | 1 |
| CASE10 | Pass, FMEM<0>=0 | Fail, FMEM<1>=1 | Pass, FMEM<2>=0 | Fail, FMEM<3>=1 | CS<0> | 1 | CS<1> | 1 |
| CASE11 | Fail, FMEM<0>=1 | Fail, FMEM<1>=1 | Pass, FMEM<2>=0 | Fail, FMEM<3>=1 | 1 | 1 | CS<0> | 1 |
| CASE12 | Pass, FMEM<0>=0 | Pass, FMEM<1>=0 | Fail, FMEM<2>=1 | Fail, FMEM<3>=1 | CS<0> | CS<1> | 1 | 1 |
| CASE13 | Fail, FMEM<0>=1 | Pass, FMEM<1>=0 | Fail, FMEM<2>=1 | Fail, FMEM<3>=1 | 1 | CS<0> | 1 | 1 |
| CASE14 | Pass, FMEM<0>=0 | Fail, FMEM<1>=1 | Fail, FMEM<2>=1 | Fail, FMEM<3>=1 | CS<0> | 1 | 1 | 1 |
| CASE15 | Fail, FMEM<0>=1 | Fail, FMEM<1>=1 | Fail, FMEM<2>=1 | Fail, FMEM<3>=1 | 1 | 1 | 1 | 1 |

FIG. 13

BUFFER CHIP, SEMICONDUCTOR PACKAGE INCLUDING BUFFER CHIP AND MEMORY CHIP, AND MEMORY MODULE

CROSS-REFERENCE TO RELATED APPLICATION

This application claims priority under 35 U.S.C. § 119(a) to Korean Patent Application No. 10-2023-0032911 filed on Mar. 14, 2023 and Korean Patent Application No. 10-2023-0101718 filed on Aug. 3, 2023, in the Korean Intellectual Property Office, which are incorporated herein by reference in its entirety.

BACKGROUND

1. Technical Field

Embodiments of the present disclosure relate to a semiconductor package including a buffer chip and a memory chip, and a memory module including the same.

2. Related Art

Recently, as application fields utilizing artificial intelligence and big data increase, the amount of data to be processed is explosively increasing. Many computer systems (for example, data centers, servers, and the like) require a large amount of memory, and applications using the computer systems require a larger amount of memory than system capabilities. However, it is becoming increasingly difficult to add a memory to the computer system due to issues such as latency and bandwidth. Various methods for increasing the amount of a memory in a system while maintaining low latency and a high bandwidth are being studied.

SUMMARY

In an embodiment, a buffer chip may include: a chip select signal reception circuit configured to receive system chip select signals transmitted from a memory controller; a chip select signal mapping circuit configured to generate memory chip select signals by mapping the system chip select signals by using failed memory chip information; and a chip select signal transmission circuit configured to transmit the memory chip select signals to a plurality of memory chips.

In an embodiment, a memory module may include: a module controller including a host interface for communication with a host, a memory controller logic for memory control, and a memory interface for transmission of control signals and transmission and reception of data; and a plurality of semiconductor packages connected to the module controller, wherein each of the plurality of semiconductor packages may include: a buffer chip receiving the control signals from the memory interface and transmitting and receiving the data to and from the memory interface; and a plurality of memory chips receiving the control signals through the buffer chip and transmitting and receiving the data through the buffer chip, and the buffer chip may include: a chip select signal reception circuit configured to receive system chip select signals included in the control signals; a chip select signal mapping circuit configured to generate memory chip select signals by mapping the system chip select signals by using failed memory chip information;

and a chip select signal transmission circuit configured to transmit the memory chip select signals to a plurality of memory chips.

In an embodiment, a semiconductor package may include: a package substrate including a plurality of terminals to communicate with a memory controller and a plurality of bonding pads to communicate inside a package; a buffer chip stacked on the package substrate; a plurality of memory chips stacked on the buffer chip; and a plurality of wires connecting the plurality of bonding pads and the plurality of memory chips, wherein the buffer chip may communicate with the memory controller through the plurality of terminals of the package substrate, the plurality of memory chips may communicate with the buffer chip through the plurality of wires and the plurality of bonding pads of the package substrate, and the buffer chip may include: a chip select signal reception circuit configured to receive system chip select signals transmitted from a memory controller; a chip select signal mapping circuit configured to generate memory chip select signals by mapping the system chip select signals by using failed memory chip information; and a chip select signal transmission circuit configured to transmit the memory chip select signals to a plurality of memory chips.

BRIEF DESCRIPTION OF THE DRAWINGS

FIG. 5 is a configuration diagram of an embodiment of a control signal transmission circuit 350 in FIG. 3.

FIG. 9 is a diagram illustrating a general fail state of the memory chips of the memory packages 120_0 to 120_9 of the channel CH0 of the memory module 100.

FIG. 11 is a table illustrating how a chip select signal mapping circuit 1020 generates memory chip select signals M_CS<0:3>.

FIG. 13 is a diagram illustrating allocation of ranks to memory chips in the fail state illustrated in FIG. 9 when the buffer chip 220 of FIG. 10 is applied.

DETAILED DESCRIPTION

Various embodiments are directed to allowing a semiconductor package to be available even though some of memory chips included in the semiconductor package are defective.

Embodiments of the present disclosure can allow a semiconductor package to be available even though some of memory chips included in the semiconductor package are defective.

Hereafter, embodiments in accordance with the technical spirit of the present disclosure will be described with reference to the accompanying drawings.

Figure 1:
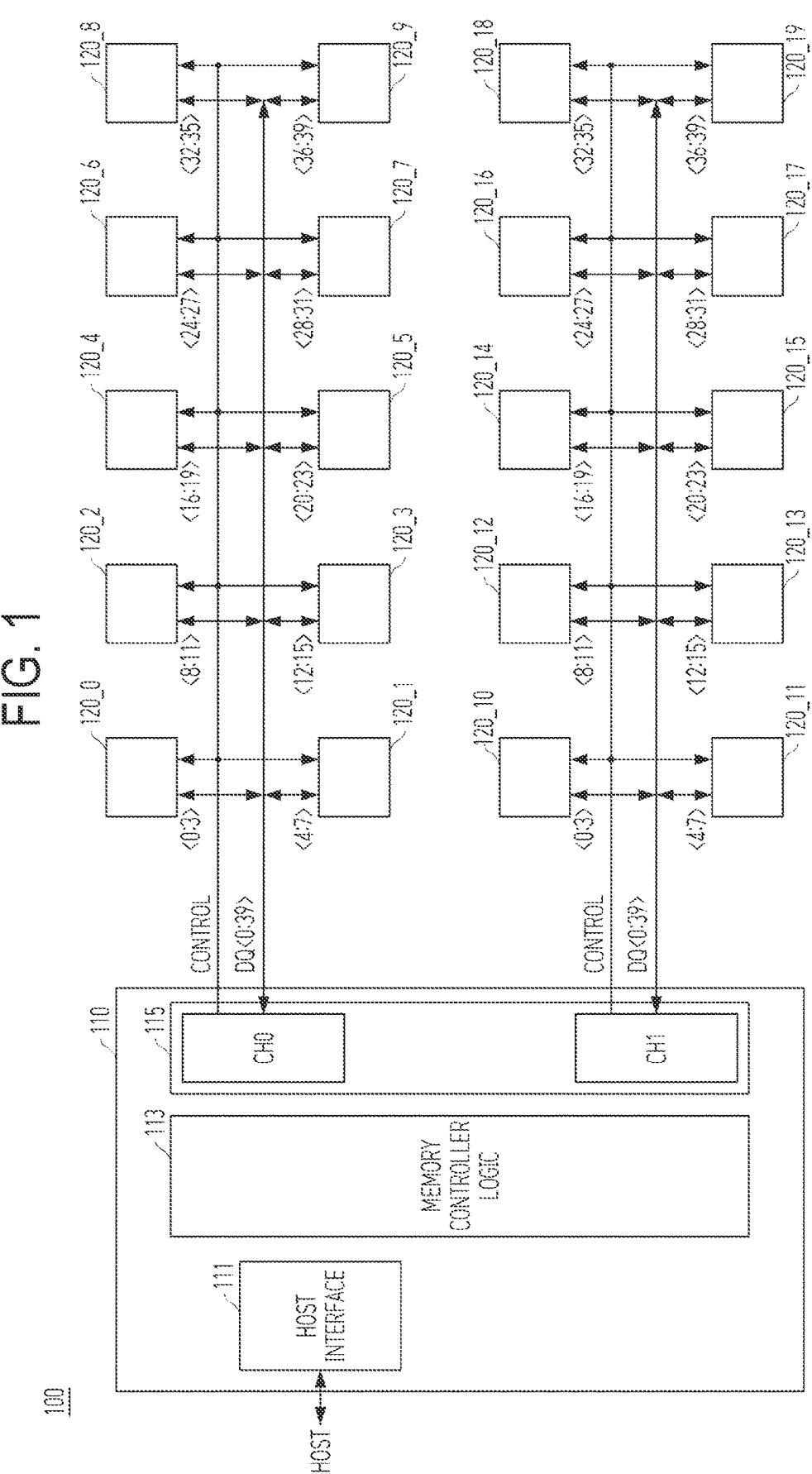
FIG. 1 is a configuration diagram of a memory module 100 in accordance with an embodiment.

FIG. 1 is a configuration diagram of a memory module 100 in accordance with an embodiment.

Referring to FIG. 1, the memory module 100 may include a module controller 110 and memory packages 120_0 to 120_19.

The module controller 110 may include a host interface 111, a memory controller logic 113, and a memory interface 115. The memory controller logic 113 and the memory interface 115 are also referred to as a memory controller.

The host interface 111 may be used for communication between the module controller 110 and a host HOST (computer system). The host interface 111 may be a compute express link (CXL) interface. The CXL interface may be an interface based on peripheral component interconnect express (PCIe) and may be an interface made so that a central processing unit (CPU), a graphic processing unit (GPU), and various types of accelerators more efficiently use a memory and the like. By connecting the memory module 100 to the host HOST through the CXL interface, the memory capacity of a computer system, such as a data center and a server, can be increased, and various processors in the computer system can share the memory.

The memory controller logic 113 may be a logic for controlling the memory packages 120_0 to 120_19, and the memory interface 115 may be an interface for communicating with the memory packages 120_0 to 120_19. The memory interface 115 may include two channels CH0 and CH1. Ten memory packages 120_0 to 120_9 may be connected to the channel CH0 of the memory interface 115, and ten memory packages 120_10 to 120_19 may be connected to the channel CH1.

The channel CH0 of the memory interface 115 may be connected to the memory packages 120_0 to 120_9 through 40 data lines DQ<0:39>. Four different data lines may be connected to the memory packages 120_0 to 120_9. For example, four data lines DQ<0:3> may be connected to the memory package 120_0, and four data lines DQ<4:7> may be connected to the memory package 120_1.

The channel CH0 of the memory interface 115 may be connected to the memory packages 120_0 to 120_9 through control signal transmission lines CONTROL. The control signal transmission lines CONTROL may include a plurality of lines and may be common to the memory packages 120_0 to 120_9. For example, all of the control signal transmission lines CONTROL may be connected to the memory package 120_0 and may also be connected to the memory package 120_1. Although not illustrated in the drawing, lines for transmitting clocks and data strobe signals may be further connected between the channel CH0 of the memory interface 115 and the memory packages 120_0 to 120_9.

The channel CH1 of the memory interface 115 and the memory packages 120_10 to 120_19 may be connected in the same way as the channel CH0 and the memory packages 120_0 to 120_9.

Each of the memory packages 120_0 to 120_19 may include one or more memory chips (for example, DRAM chips). Because one of the important reasons for using the memory module 100 is to greatly increase the capacity of a memory, it may be general assumed that each of the memory packages 120_0 to 120_19 includes a plurality of memory chips. A method such as three-dimensional stacking (3DS) may be used to put a plurality of memory chips into a memory package. The 3DS method may use a through-silicon via (TSV) for communication between memory chips in a memory package. However, when a memory package is manufactured in this way, the price of the memory package may increase because a lot of time and cost are required in packaging.

In the memory module 100, each of the memory packages 120_0 to 120_19 may include a buffer chip and a plurality of memory chips. The buffer chip may perform a buffer operation between the module controller 110 and the plurality of memory chips. The plurality of memory chips included in each of the memory packages 120_0 to 120_19 may be connected to the buffer chip through wire bonding. The memory module 100 may increase a memory capacity by using the plurality of memory chips and may reduce loading from an increase in memory by using a buffer chip.

However, the configuration of the memory packages 120_0 to 120_19 disclosed is merely an example and might not be limited thereto. For example, each of the memory packages 120_0 to 120_19 may include different types of memory chips. For example, at least one of the memory packages 120_0 to 120_19 may have a different configuration from other memory packages and/or may be connected to the module controller 110 in a different way. For example, memory chips included in at least one of the memory packages 120_0 to 120_19 may be integrated using a three-dimensional stacking (3DS) method, a monolithic 3D (M3D) method, or the like. For example, memory chips included in at least one of the memory packages 120_0 to 120_19 may communicate with each other by using through-silicon vias (TSVs) or vias with a smaller size and higher density than the TSVs.

The form factor of the memory module 100 may have various forms, such as an add-in-card (AIC) and an enterprise and data center SSD form factor (EDSFF).

Figure 2:
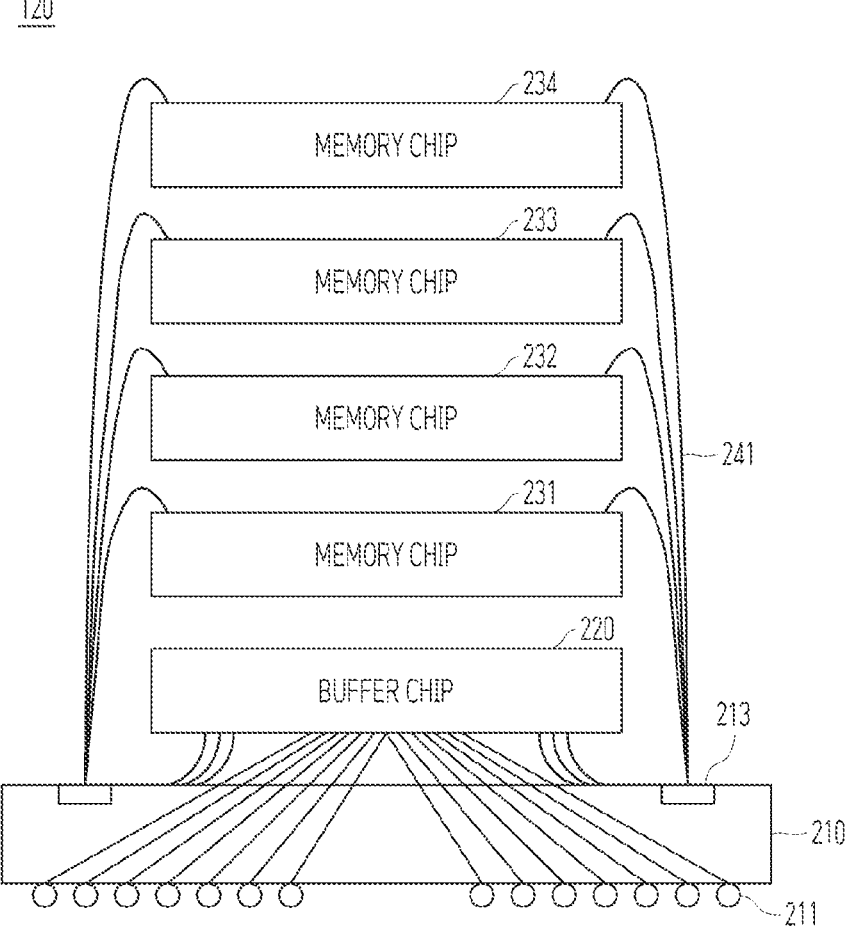
FIG. 2 is a configuration diagram of an embodiment of a memory package 120 in FIG. 1.

FIG. 2 is a configuration diagram of an embodiment of the memory package 120 in FIG. 1.

Referring to FIG. 2, the memory package 120 may include a package substrate 210, a buffer chip 220, and a plurality of memory chips 231 to 234.

The package substrate 210 may include a plurality of package balls 211 that are terminals to communicate with the memory interface 115 (FIG. 1) and a plurality of bonding pads 213 to communicate inside the memory package 120.

The buffer chip 220 may be disposed on the package substrate 210. The buffer chip 220 may communicate with the memory interface 115 (FIG. 1) through the package balls 211 of the package substrate 210. The buffer chip 220 may further communicate with the memory chips 231 to 234 through the bonding pads 213 of the package substrate 210.

The memory chips 231 to 234 may be stacked on the buffer chip 220 and may communicate with the buffer chip 220 through wires 241 connecting the bonding pads 213 with the memory chips 231 to 234. The memory chips 231 to 234 may communicate with the memory interface 115 (FIG. 1) through the buffer chip 220. The control signals CONTROL (FIG. 1) and the data DQ<0:39> (FIG. 1) transmitted from the memory interface 115 (FIG. 1) may be transmitted to the buffer chip 220 through the package balls 211, buffered, and then transmitted from the buffer chip 220 to the memory chips 231 to 234 through the bonding pads 213. Data transmitted from the memory chips 231 to 234 may be transmitted to the buffer chip 220 through the bonding pads 213, buffered, and then transmitted to the memory interface 115 (FIG. 1) through the package balls 211.

Because only the buffer chip 220, among the chips of the memory package 120, may be connected to the memory interface 115 (FIG. 1), loading between the memory package 120 and the memory interface 115 (FIG. 1) may be reduced to enable a high-speed operation. Because the buffer chip 220 and the memory chips 231 to 234 are connected through wiring, instead of a TSV that consumes a lot of cost in a manufacturing process, the manufacturing cost of the memory package 120 may be reduced.

Figure 3:
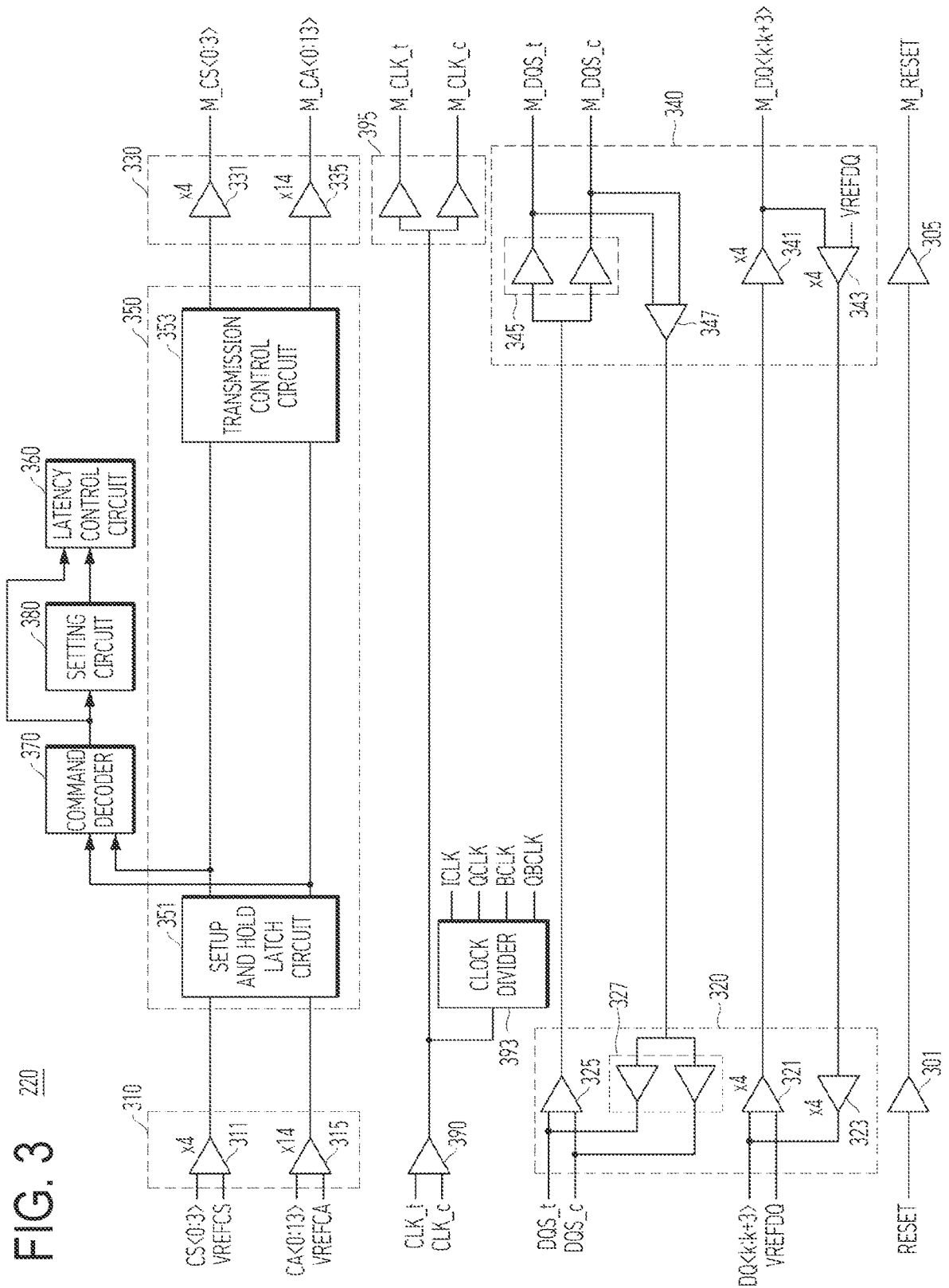
FIG. 3 is a configuration diagram of an embodiment of a buffer chip 220 in FIG. 2.

FIG. 3 is a configuration diagram of an embodiment of the buffer chip 220 in FIG. 2.

Referring to FIG. 3, the buffer chip 220 may include an external control signal interface 310, an external data interface 320, an internal control signal interface 330, an internal data interface 340, a control signal transmission circuit 350, a latency control circuit 360, a command decoder 370, a setting circuit 380, a clock reception circuit 390, a clock divider 393, and a clock transmission circuit 395.

The external control signal interface 310 may receive the control signals CONTROL (FIG. 1) transmitted from the memory interface 115 (FIG. 1). The control signals CONTROL (FIG. 1) may include chip select signals CS<0:3> and command address signals CA<0:13>. The external control signal interface 310 may include a chip select signal reception circuit 311 and a command address reception circuit 315.

The chip select signals CS<0:3> may be used for distinguishing the memory chips 231 to 234 (FIG. 2) in the memory package 120 (FIG. 2), that is, for distinguishing ranks, and the number of chip select signals CS<0:3> may be the same as the number of the memory chips 231 to 234 (FIG. 2) in the memory package 120 (FIG. 2). In FIG. 3, because the number of chip select signals CS<0:3> is illustrated as 4, the chip select signal reception circuit 311 may include four reception buffers. Buffers of the chip select signal reception circuit 311 may receive the chip select signals CS<0:3> by comparing voltage levels of the chip select reference voltage VREFCS with the chip select signals CS<0:3>. However, the number of chip select signals and the number of memory chips are not limited thereto.

The command address reception circuit 315 may include the same number of reception buffers as the number of command address signals CA<0:13>. In FIG. 3, because the number of command address signals CA<0:13> is illustrated as 14, the command address reception circuit 315 may include 14 reception buffers. Buffers of the command address reception circuit 315 may receive the command address signals CA<0:13> by comparing voltage levels of a command address reference voltage VREFCA with the command address signals CA<0:13>. However, the number of command address signals and the number of reception buffers are not limited thereto.

The external data interface 320 may transmit/receive data DQ<k:k+3> (K is an integer equal to or greater than 0) to/from the memory interface 115 (FIG. 1). The external data interface 320 may transmit/receive not only the data DQ<k:k+3> but also data strobe signals DQS_t and DQS_c for strobing the data DQ<k:k+3>. The external data interface 320 may include an external data reception circuit 321, an external data transmission circuit 323, an external data strobe reception circuit 325, and an external data strobe transmission circuit 327.

The external data reception circuit 321 may include the same number of reception buffers as the number of terminals to which the data DQ<k:k+3> are input. In FIG. 3, because four data terminals are provided for each memory package 120 (FIG. 2), the external data reception circuit 321 may include four reception buffers. Buffers of the external data reception circuit 321 may receive the data DQ<k:k+3> by comparing voltage levels of the data reference voltage VREFDQ with the data DQ<k:k+3>. However, the number of terminals and the number of reception buffers are not limited thereto.

The external data strobe reception circuit 325 may receive the data strobe signals DQS_t and DQS_c transmitted from the memory interface 115 (FIG. 1) as the data DQ<k:k+3> is received by the external data reception circuit 321. Because the data strobe signals DQS_t and DQS_c are differential-type signals, the external data strobe reception circuit 325 may include a reception buffer that compares voltage levels of a positive data strobe signal DQS_t with a negative data strobe signal DQS_c.

The external data transmission circuit 323 may transmit the data DQ<k:k+3>. The external data transmission circuit 323 may include four transmission drivers.

The external data strobe transmission circuit 327 may transmit the data strobe signals DQS_t and DQS_c for strobing the data DQ<k:k+3> transmitted by the external data transmission circuit 323. The external data strobe transmission circuit 327 may include two transmission drivers.

The clock reception circuit 390 may receive clocks CLK_t and CLK_c transmitted from the memory interface 115 (FIG. 1). Because the clocks CLK_t and CLK_c are differential-type signals, the clock reception circuit 390 may include a reception buffer that compares voltage levels of the regular clock CLK_t with the secondary clock CLK_C.

The clock divider 393 may divide the clocks CLK_t and CLK_c received by the clock reception circuit 390. First to fourth clocks ICLK, QCLK, BCLK, and QBCLK generated by the clock divider 393 may each have a frequency of half the frequency of each of the clocks CLK_t and CLK_c and may have different phases. The clocks CLK_t and CLK_c received by the clock reception circuit 390 and the first to fourth clocks ICLK, QCLK, BCLK, and QBCLK generated by the clock divider 393 may be used by various components inside the buffer chip 220.

The control signal transmission circuit 350 may buffer the control signals received through the external control signal interface 310 and may transmit the buffered control signals to the internal control signal interface 330. The control signal transmission circuit 350 may include a setup and hold latch circuit 351 for securing a setup hold margin and a transmission control circuit 353 for performing a buffering operation.

The internal control signal interface 330 may transmit control signals M_CS<0:3> and M_CA<0:13> transmitted through the control signal transmission circuit 350 to the memory chips 231 to 234 (FIG. 2). The command address signals M_CA<0:13> may be transmitted in common to the memory chips 231 to 234 (FIG. 2), and the chip select signals M_CS<0:3> may be transmitted to the memory chips 231 to 234 (FIG. 2) in a one-to-one manner. That is, the chip select signal M_CS<0> may be transmitted to the memory chip 231 (FIG. 2), the chip select signal M_CS<1> may be transmitted to the memory chip 232 (FIG. 2), the chip select signal M_CS<2> may be transmitted to the memory chip 233 (FIG. 2), and the chip select signal M_CS<3> may be transmitted to the memory chip 234 (FIG. 2).

The internal control signal interface 330 may include a chip select signal transmission circuit 331 and a command address transmission circuit 335. Because the number of chip select signals M_CS<0:3> is 4, the chip select signal transmission circuit 331 may include four transmission drivers. Also, because the number of command address signals M_CA<0:13> is 14, the command address transmission circuit 335 may include 14 transmission drivers.

The internal data interface 340 may transmit/receive data M_DQ<k:k+3> to/from the memory chips 231 to 234 (FIG. 2). The data M_DQ<k:k+3> may be connected in common to the memory chips 231 to 234 (FIG. 2). When the data M_DQ<k:k+3> is transmitted in common to the memory chips 231 to 234 (FIG. 2) during a write operation, a memory chip selected to perform a write operation, among the memory chips 231 to 234 (FIG. 2), may receive the data M_DQ<k:k+3> transmitted by the internal data interface 340. During a read operation, a memory chip selected to perform a read operation, among the memory chips 231 to 234, may transmit the data M_DQ<k:k+3> to the internal data interface 340. The internal data interface 340 may transmit/receive not only the data M_DQ<k:k+3> but also the data strobe signals M_DQS_t and M_DQS_c for strobing the data M_DQ<k:k+3> to/from the memory chips 231 to 234 (FIG. 2).

The internal data interface 340 may include an internal data transmission circuit 341, an internal data reception circuit 343, an internal data strobe transmission circuit 345, and an internal data strobe reception circuit 347. The internal data transmission circuit 341 may include four transmission drivers, and the internal data reception circuit 343 may include four reception buffers. The internal data strobe transmission circuit 345 may include two transmission drivers, and the internal data strobe receive circuit 347 may include one reception buffer.

The clock transmission circuit 395 may transmit the clocks M_CLK_t and M_CLK_c to the memory chips 231 to 234 (FIG. 2). The clocks M_CLK_t and M_CLK_c may be transmitted in common to the memory chips 231 to 234 (FIG. 2). The clock transmission circuit 395 may include two transmission drivers.

The command decoder 370 may decode the chip select signals CS<0:3> and the command address signals CA<0:13> received through the external control signal interface 310. The command decoder 370 may receive and decode control signals latched by the setup and hold latch circuit 351 after being received by the external control signal interface 310. The chip select signals CS<0:3> may indicate the validity of the command address signals CA<0:13>, and when even one of the four chip select signals CS<0:3> is activated to a low level, the command decoder 370 of the buffer chip 220 may determine that the command address signals CA<0:13> are valid and may decode the command address signals CA<0:13>.

The setting circuit 380 may perform a setting operation according to the decoding result of the command decoder 370. Setting items of the setting circuit 380 may include a read latency of the buffer chip 220, a write latency of the buffer chip 220, levels of reference voltages used by the buffer chip 220, a termination resistance value (also referred to as Rtt) of the buffers of the buffer chip 220, a termination resistance value (also referred to as Ron) of the drivers of the buffer chip 220, an equalizing coefficient (for example, a coefficient of decision feedback equalization) of the buffer chip 220, a command rate, and the like.

The latency control circuit 360 may control whether to activate the external data interface 320 and the internal data interface 340. The latency control circuit 360 may activate the external data reception circuit 321 and the internal data transmission circuit 341 so that the data DQ<k:k+3> transmitted from the memory interface 115 (FIG. 1) to the buffer chip 220 may be received after a write latency set by the setting circuit 380 from the time point at which a write command is applied to the buffer chip 220 and transmitted to the memory chips 231 to 234 (FIG. 2). The latency control circuit 360 may further activate the internal data reception circuit 343 and the external data transmission circuit 323 so that data DQ<k:k+3> buffered after being received from the memory chips 231 to 234 (FIG. 2) may be transmitted from the buffer chip 220 to the memory interface 115 (FIG. 1) after a read latency set by the setting circuit 380 from the time point at which a read command is applied to the buffer chip 220. The latency control circuit 360 may activate the external data strobe reception circuit 325 and the internal data strobe transmission circuit 345 during the write operation and may activate the internal data strobe reception circuit 347 and the external data strobe transmission circuit 327 during the read operation so that the data strobe signals DQS_t and DQS_c may also be transmitted and received together with the data DQ<k:k+3>. The latency control circuit 360 may receive information indicating that the read command and the write command have been applied to the buffer chip 220 from the command decoder 370 and may receive information related to the read latency and the write latency from the setting circuit 380.

Figure 4:
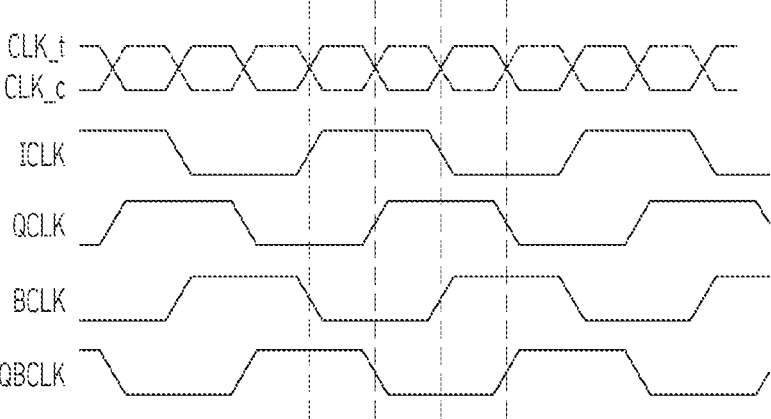
FIG. 4 is a diagram illustrating first to fourth clocks ICLK, QCLK, BCLK, and QBCLK generated by a clock divider 390 in FIG. 3.

FIG. 4 is a diagram illustrating the first to fourth clocks ICLK, QCLK, BCLK, and QBCLK generated by the clock divider 393 in FIG. 3.

Referring to FIG. 4, the first to fourth clocks ICLK, QCLK, BCLK, and QBCLK generated by the clock divider 393 may each have a frequency of half the frequency of each of the clocks CLK_t and CLK_c. Furthermore, each of the first to fourth clocks ICLK, QCLK, BCLK, and QBCLK may have a phase difference of 90° in comparison to a preceding or subsequent clock (i.e., a phase difference between the second clock QCLK and the third clock BCLK, between the fourth clock QBCLK and the first clock ICLK, etc.).

Figure 5:
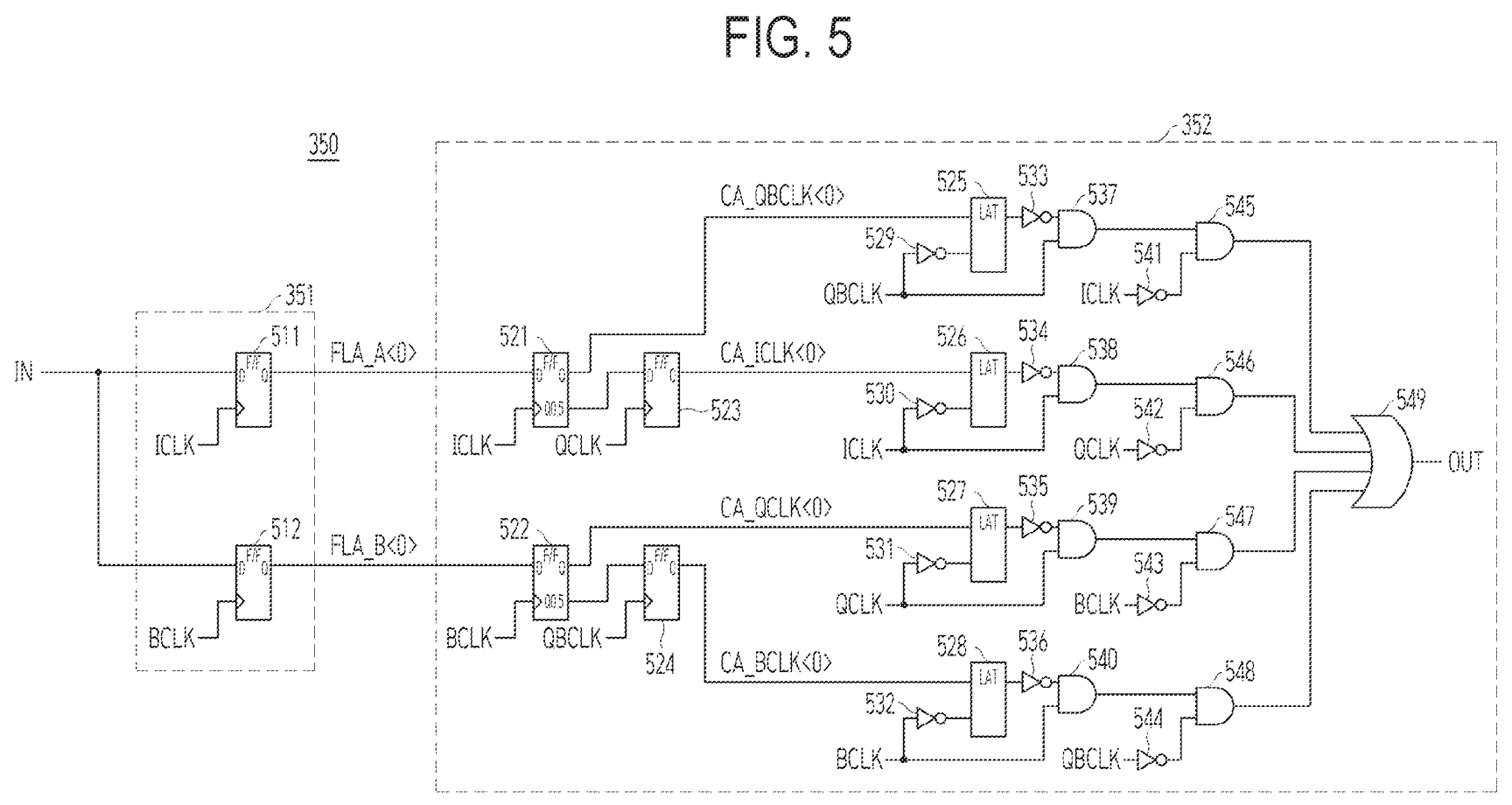
Figure 6:
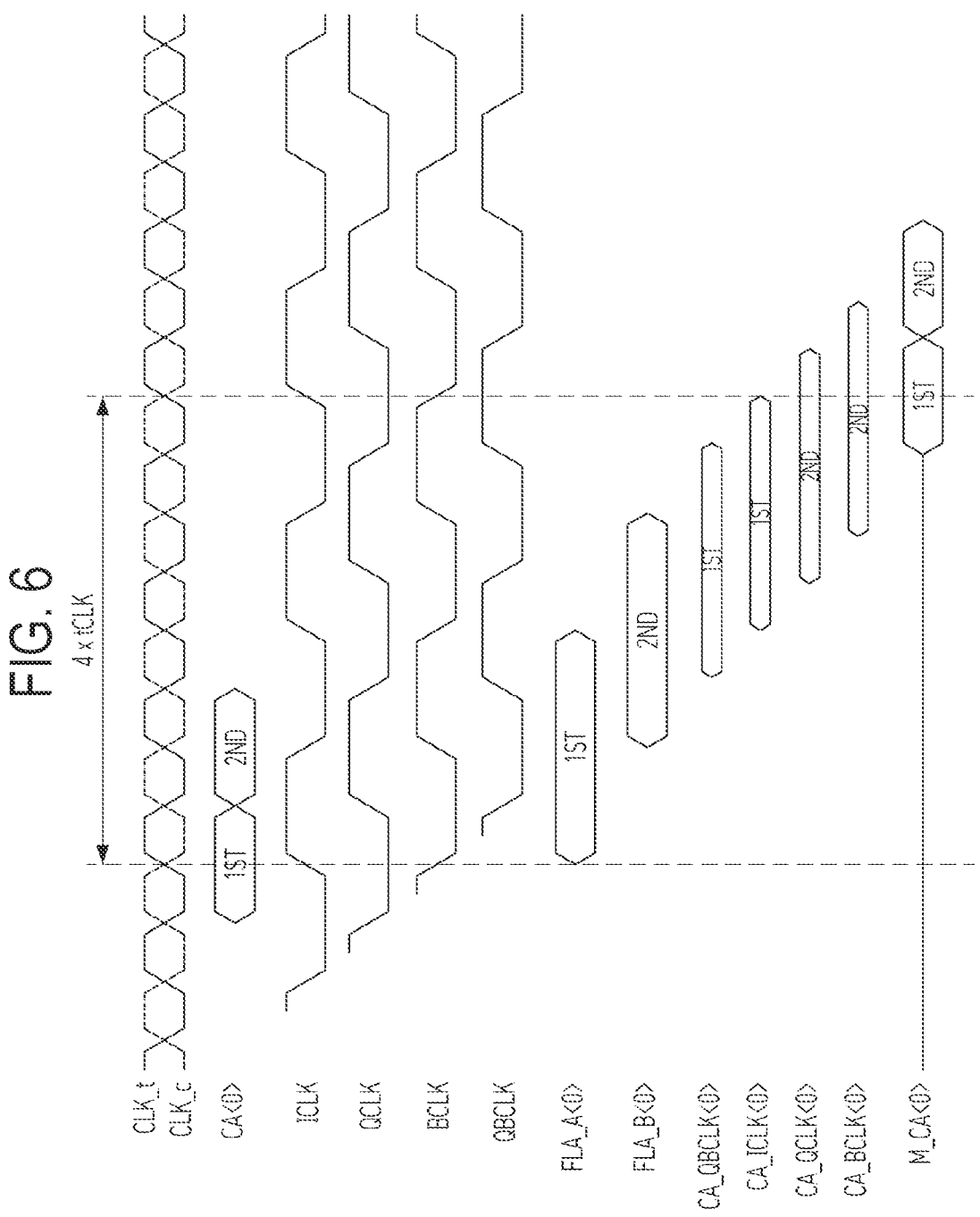
FIG. 6 is an operation timing diagram of the control signal transmission circuit 350 in FIG. 5.

FIG. 5 is a configuration diagram of an embodiment of the control signal transmission circuit 350 in FIG. 3, and FIG. 6 is an operation timing diagram of the control signal transmission circuit 350. FIG. 5 illustrates components for transmitting the command address signal CA<0> in the control signal transmission circuit 350. The remaining control signals CA<1:13> and CS<0:3> may also be transmitted in the same way as the command address signal CA<0>.

Referring to FIG. 5, the setup and hold latch circuit 351 of the control signal transmission circuit 350 may include D flip-flops 511 and 512. An input IN of the D flip-flops 511 and 512 may be an output of a buffer of the command address reception circuit 315 in FIG. 3, which receives the command address signal CA<0>. The D flip-flop 511 may receive an input at a rising edge of a first clock ICLK, latch the received input, and output a signal FLA_A<0>. On the other hand, the D flip-flop 512 may receive an input at a rising edge of a third clock BCLK, latch the received input, and output a signal FLA_B<0>. Referring to FIGS. 5 and 6, a signal 1ST, which is a first cycle of the command address signal CA<0>, may be latched by the D flip-flop 511 and may be output as the signal FLA_A<0>, and a signal 2ND, which is a second cycle of the command address signal CA<0>, may be latched by the D flip-flop 512 and may be output as the signal FLA_B<0>.

The transmission control circuit 352 of the control signal transmission circuit 350 may include D flip-flops 521 to 524, D latches 525 to 528, inverters 529 to 536 and 541 to 544, AND gates 537 to 540 and 545 to 548, and an OR gate 549.

Figure 7:
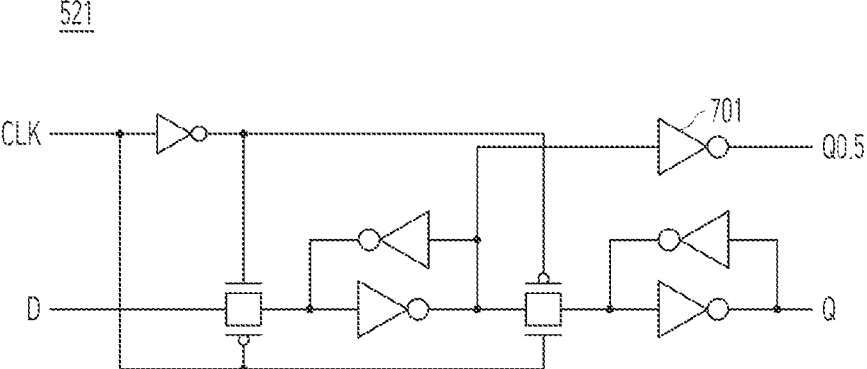
FIG. 7 is a diagram illustrating an internal configuration of a D flip-flop 521.

The D flip-flop 521 may receive and latch the signal FLA_A<0> at the rising edge of the first clock ICLK. A signal output as an output Q of the D flip-flop 521 may be indicated by CA_QBCLK<0>. An output Q0.5 of the D flip-flop 521 may be an output of a first stage of the D flip-flop 521 including two stages. FIG. 7 illustrates the internal configuration of the D flip-flop 521, and the D flip-flop 521 may further include an inverter 701 for outputting the output Q0.5 from a latch of the first stage in addition to the configuration of a general D flip-flop. The D flip-flop 523 may receive and latch the output Q0.5 of the D flip-flop 521 at a rising edge of the second clock QCLK and may output the latched output as a signal CA_ICLK<0>. Referring to FIG. 6, the phases of the signals CA_QBCLK<0> and CA_ICLK<0> may correspond to the phases of the first clock ICLK and the second clock QCLK and may have the same phase differences.

The D flip-flop 522 may receive and latch the signal FLA_B<0> at the rising edge of the third clock BCLK. A signal output as an output Q of the D flip-flop 522 may be indicated by CA_QCLK<0>. The D flip-flop 524 may receive and latch an output Q0.5 of the D flip-flop 522 at a rising edge of the fourth clock QBCLK and may output the latched output as a signal CA_BCLK<0>. Referring to FIG. 6, the phases of the signals CA_QCLK<0> and CA_BCLK<0> may correspond to the phases of third clock BCLK and the fourth clock QBCLK and may have the same phase differences.

The D latch 525 may latch and output the signal CA_QBCLK<0> while the fourth clock QBCLK is at a low level, an output of the D latch 525 may be inverted by the inverter 533, and an output of the inverter 533 and the fourth clock QBCLK may be input to the AND gate 537. An output of the AND gate 537 may be input to the AND gate 545 together with the first clock ICLK inverted by the inverter 541.

The D latch 526 may latch and output the signal CA_ICLK<0> while the first clock ICLK is at a low level, an output of the D latch 526 may be inverted by the inverter 534, and an output of the inverter 534 and the first clock ICLK may be input to the AND gate 538. An output of the AND gate 538 may be input to the AND gate 546 together with the second clock QCLK inverted by the inverter 542.

The D latch 527 may latch and output the signal CA_QCLK<0> while the second clock QCLK is at a low level, an output of the D latch 527 may be inverted by the inverter 535, and an output of the inverter 535 and the second clock QCLK may be input to the AND gate 539. An output of the AND gate 539 may be input to the AND gate 547 together with the third clock BCLK inverted by the inverter 543.

The D latch 528 may latch and output the signal CA_BCLK<0> while the third clock BCLK is at a low level, an output of the D latch 528 may be inverted by the inverter 536, and an output of the inverter 536 and the third clock BCLK may be input to the AND gate 540. An output of the AND gate 540 may be input to the AND gate 548 together with the fourth clock QBCLK inverted by the inverter 544.

Outputs of the AND gates 545 to 548 may be input to the OR gate 549, and an output OUT of the OR gate 549 may be an input of a driver of the command address transmission circuit 335 in FIG. 3, which transmits the command address signal M_CA<0>.

Referring to FIG. 6, the command address signal CA<0> received from the memory interface 115 (FIG. 1) by the command address reception circuit 315 of the buffer chip 220 may be buffered by the control signal transmission circuit 350, delayed by 4 clock cycles based on the clocks CLK_t and CLK_c, and transmitted to the memory chips 231 to 234 (FIG. 2) by the command address transmission circuit 335.

Referring now back to FIG. 1 and FIG. 2, the memory module 100 may include the plurality of memory packages 120_0 to 120_19, and each of the memory packages 120_0 to 120_19 may include the plurality of memory chips 231 to 234. All the memory chips 231 to 234 that are inside the memory packages 120_0 to 120_19 may operate normally, but in the process of manufacturing the memory packages 120_0 to 120_19 by stacking the memory chips 231 to 234, memory chips may fail in the memory chips 231 to 234 stacked in the memory packages 120_0 to 120_19.

Figure 8:
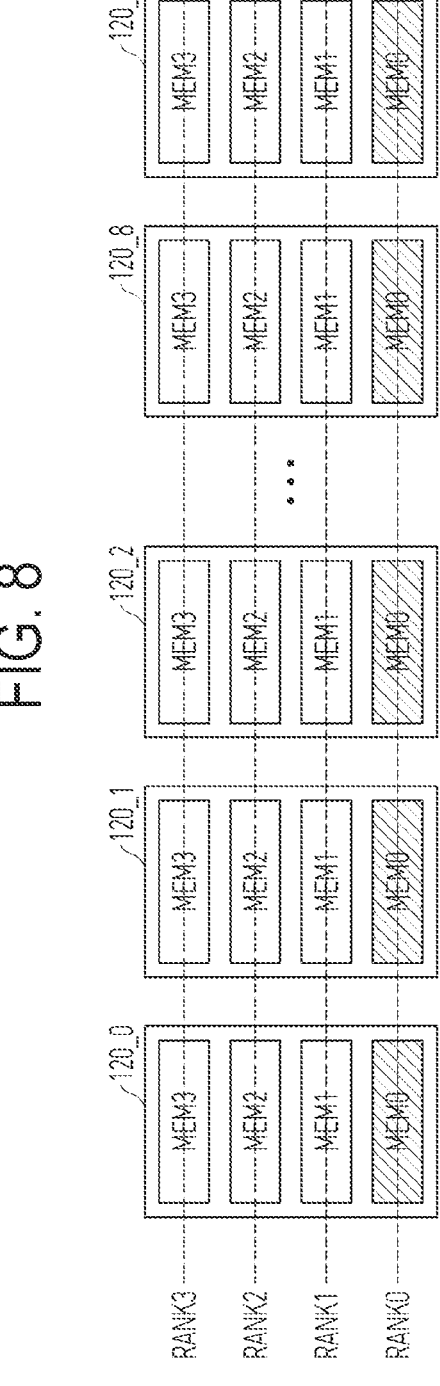
FIG. 8 is a diagram illustrating an ideal fail state of memory chips of memory packages 120_0 to 120_9 of a channel CH0 of the memory module 100.

FIG. 8 is a diagram illustrating an ideal fail state of memory chips of the memory packages 120_0 to 120_9 of the channel CH0 of the memory module 100. FIG. 8 illustrates four memory chips MEM0 to MEM3 included in each of the memory packages 120_0 to 120_9, and among the four memory chips MEM0 to MEM3, failed memory chips that are formed.

Referring to FIG. 8, only the memory chips MEM0 of rank 0 RANK0 may have failed in all the memory packages 120_0 to 120_9 and may be considered failed memory chips. The memory chips MEM0 of the rank 0 may mean memory chips selected by a chip select signal CS<0>. Because only the memory chips MEM0 of the rank 0 RANK0 are failed memory chips, among the memory packages 120_0 to 120_9, the memory controllers 113 and 115 might not use the rank 0 (that is, the chip select signal CS<0> is always fixed in a deactivated state) and may overcome a failure by using only passed memory chips MEM1 to MEM3 of rank 1 RANK1 to rank 3 RANK3 (that is, by using only chip select signals CS<1:3>). That is, the memory packages 120_0 to 120_9 including failed memory chips may be used without being discarded.

However, in actuality, the probability of failure occurring only in memory chips of the same rank in all the memory packages 120_0 to 120_9 is very low.

Figure 9:
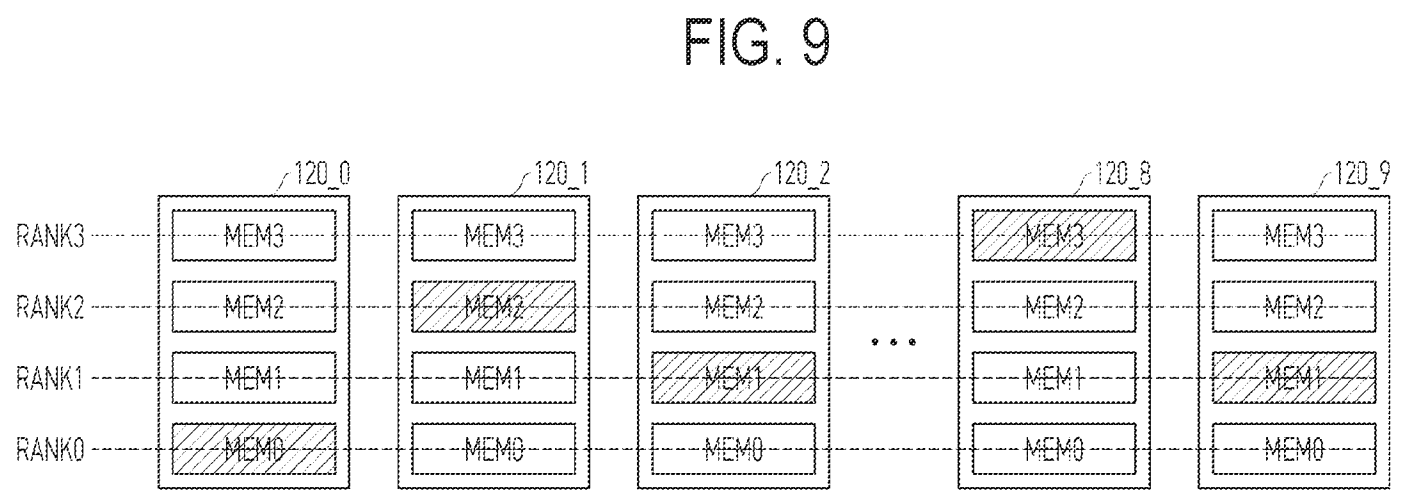

FIG. 9 is a diagram illustrating a general fail state of the memory chips of the memory packages 120_0 to 120_9 of the channel CH0 of the memory module 100.

In FIG. 9, the memory chip MEM0 of rank 0 RANK0 may be a failed memory chip in the memory package 120_0, but the memory chip MEM2 of rank 2 RANK2 may be a failed memory chip in the memory package 120_1, and the memory chip MEM1 of rank 1 RANK1 may be a failed memory chip in the memory package 120_2, that is, the memory chips MEM0 to MEM3 of various ranks may be failed memory chips in the memory packages 120_0 to 120_9.

When the memory chips MEM0 to MEM3 of various ranks are failed memory chips in the memory packages 120_0 to 120_9, the memory packages 120_0 to 120_9 might not be available and the memory packages 120_0 to 120_9 may need to be discarded.

Figure 10:
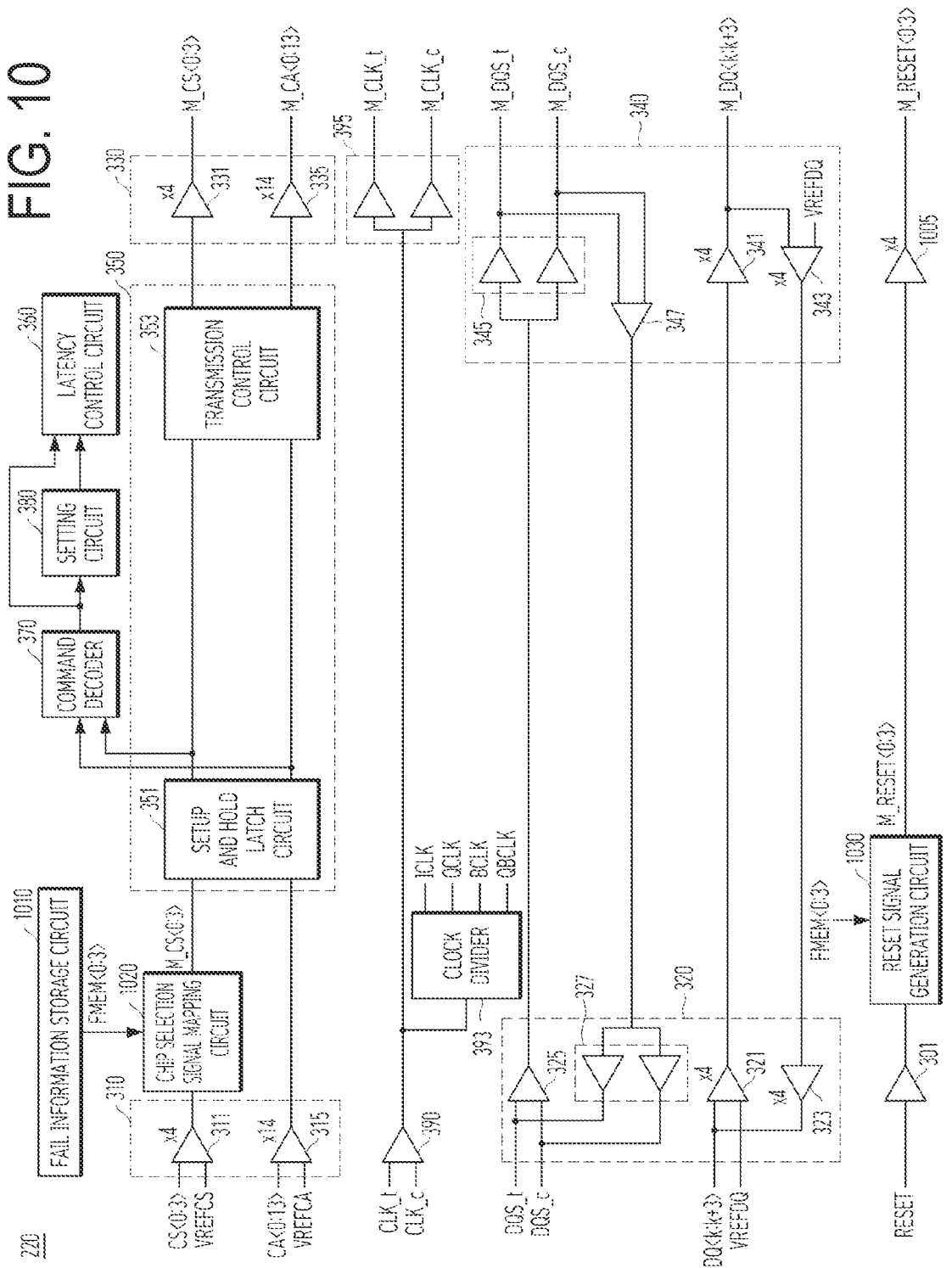
FIG. 10 is a configuration diagram of another embodiment of the buffer chip 220 in FIG. 2.

FIG. 10 is a configuration diagram of another embodiment of the buffer chip 220 in FIG. 2. With reference to FIG. 10, an embodiment of the buffer chip 220 in which the ranks of memory chips 231 to 234 in the memory package 120 can be changed by mapping the chip select signals CS<0:3> will be described.

Referring to FIG. 10, the buffer chip 220 may include the external control signal interface 310, the external data interface 320, the internal control signal interface 330, the internal data interface 340, the control signal transmission circuit 350, the latency control circuit 360, the command decoder 370, the setting circuit 380, the clock reception circuit 390, the clock divider 393, the clock transmission circuit 395, a reset signal reception circuit 301, a reset signal transmission circuit 1005, a fail information storage circuit 1010, a chip select signal mapping circuit 1020, and a reset signal generation circuit 1030.

The fail information storage circuit 1010 may store failed memory chip information FMEM<0:3> indicating a failed chip, among the memory chips 231 to 234. The failed memory chip information FMEM<0:3> may include four fail signals, and the four fail signals FMEM<0:3> may indicate whether the four memory chips 231 to 234 are failed memory chips. For example, activation of the fail signal FMEM<0> may indicate that the memory chip 231 is a failed chip, and activation of the fail signal FMEM<2> may indicate that the memory chip 233 is a failed chip. The fail information storage circuit 1010 may include a nonvolatile memory circuit, such as a fuse circuit.

The chip select signal mapping circuit 1020 may generate memory chip select signals M_CS<0:3> by mapping system chip select signals CS<0:3> by using the failed memory chip information FMEM<0:3>. In this embodiment, chip select signals CS<0:3> received by the chip select signal reception circuit 311 and chip select signals M_CS<0:3> transmitted by the chip select signal transmission circuit 331 may be different from each other. Accordingly, the chip select signals CS<0:3> received by the chip select signal reception circuit 311 may be referred to as the system chip select signals CS<0:3>, and the chip select signals M_CS<0:3> transmitted by the chip select signal transmission circuit 331 may be referred to as the memory chip select signals M_CS<0:3>.

The chip select signal mapping circuit 1020 may fix a memory chip select signal corresponding to a failed memory chip, among the memory chips 231 to 234, to a high level, which is a deactivated level, and may allow the remaining memory chip select signals to correspond to system chip select signals, beginning with CS<0> and sequentially increasing, among the system chip select signals CS<0:3>, in a one-to-one manner. For example, when the memory chip 232 is a failed memory chip, the chip select signal mapping circuit 1020 may fix the memory chip select signal M_CS<1> to a high level, generate the memory chip select signal M_CS<0> identically to the system chip select signal CS<0>, generate the memory chip select signal M_CS<2> identically to the system chip select signal CS<1>, and generate the memory chip select signal M_CS<3> identically to the system chip select signal CS<2>. FIG. 11 is a table illustrating how the chip select signal mapping circuit 1020 generates the memory chip select signals M_CS<0:3>. Referring to FIG. 11, when there is no failed memory chip in the memory chips MEM0 to MEM3 (=231 to 234) (CASE0), the memory chip select signals M_CS<0:3> may be generated identically to the system chip select signals CS<0:3>. When there is a failed memory chip in some of the memory chips MEM0 to MEM3, a memory chip select signal corresponding to the failed memory chip may be fixed to a high (1) level, and the remaining memory chip select signals may be sequentially mapped with signals having sequential numbers beginning with CS<0>, among the system chip select signals. For example, when the memory chips MEM0 and MEM1 are failed memory chips (CASE3), the memory chip select signals M_CS<0> and M_CS<1> corresponding to the memory chips MEM0 and MEM1 may be fixed to the high (1) level, which is a deactivation level, the memory chip select signal M_CS<2> may be generated identically to the system chip select signal CS<0>, and the memory chip select signal M_CS<3> may be generated identically to the system chip select signal CS<1>.

Even though a failed memory chip exists among the memory chips 231 to 234 due to the mapping operation of the chip select signal mapping circuit 1020, available ranks may be consistently maintained. For example, when the memory chip 231 is a failed memory chip, the memory chips 232 to 234 may operate in rank 0 to rank 2, and when the memory chip 233 is a failed memory chip, the memory chips 231, 232, and 234 may operate in rank 0 to rank 2.

The reset signal generation circuit 1030 may generate memory reset signals M_RESET<0:3> by using the failed memory chip information FMEM<0:3> and a system reset signal RESET. The memory reset signals M_RESET<0:3> may basically be generated identically to the system reset signal RESET, but among the memory reset signals M_RESET<0:3>, a memory reset signal corresponding to a failed memory chip may be fixed to a low level indicating an activated state. For example, when the memory chip MEM1 (=232) is a failed memory chip, the memory reset signal M_RESET<1> may be fixed to a low level indicating an activated state, and the remaining memory reset signals M_RESET<0>, M_RESET<2>, and M_RESET<3> may be generated to have the same level as the system reset signal RESET. Because a memory reset signal of a failed memory chip is fixed to an activated state by the reset signal generation circuit 1030, the failed memory chip may be controlled to be in a reset state and the operation of the failed memory chip may be blocked.

The reset signal transmission circuit 1005 may transmit the memory reset signals M_RESET<0:3> generated by the reset signal generation circuit 1030 to the memory chips 231 to 234. The reset signal transmission circuit 1005 may include four transmission drivers. The memory reset signals M_RESET<0:3> may correspond to the memory chips 231 to 234 in a one-to-one manner.

The buffer chip 220 may mean any type of chip serving as an interface in the memory package 120 (FIG. 2). For example, the buffer chip 220 may be a logic die of a high bandwidth memory (HBM) or a master die of a 3DS memory.

Figure 12:
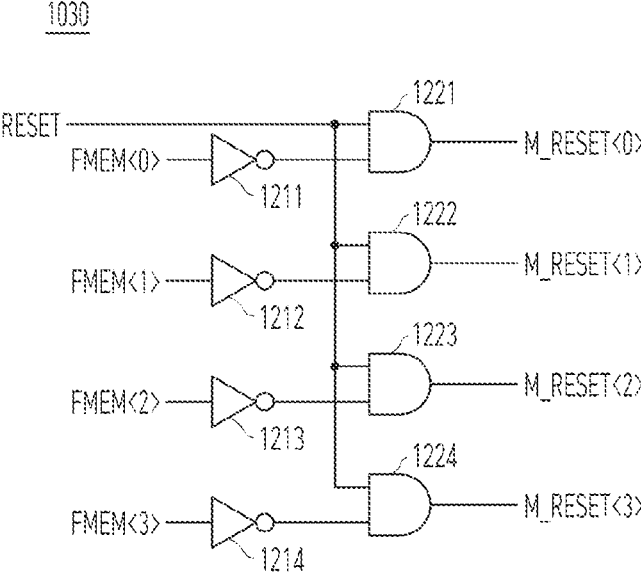
FIG. 12 is a configuration diagram of an embodiment of a reset signal generation circuit 1030 in FIG. 10.

FIG. 12 is a configuration diagram of an embodiment of the reset signal generation circuit 1030 in FIG. 10.

Referring to FIG. 12, the reset signal generation circuit 1030 may include inverters 1211 to 1214 and AND gates 1221 to 1224.

The inverters 1211 to 1214 may invert and output the fail signals FMEM<0:3>. The AND gates 1221 to 1224 may receive the system reset signal RESET and the output of the inverters 1211 to 1214 and may output the memory reset signals M_RESET<0:3>. When the fail signals FMEM<0:3> are deactivated to a low level, the memory reset signals M_RESET<0:3> may have the same level as the system reset signal RESET. However, when the fail signals FMEM<0:3> are activated to a high level, a memory reset signal corresponding to the activated fail signal may be fixed to a low level regardless of the level of the system reset signal RESET. For example, when the fail signal FMEM<3> is activated to a high level, the memory reset signal M_RESET<3> may be fixed to a low level.

Figure 13:
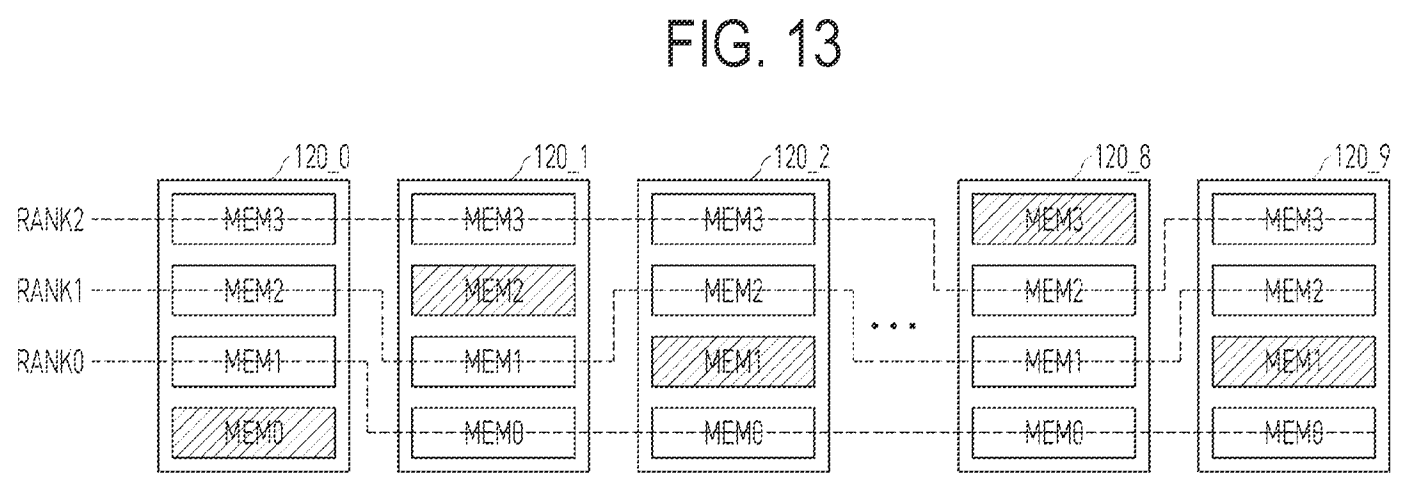

FIG. 13 is a diagram illustrating allocation of ranks to memory chips in the fail state, illustrated in FIG. 9, when the buffer chip 220 of FIG. 10 is applied.

Referring to FIG. 13, a failure may occur in the memories MEM0 to MEM3 located at different locations in the memory packages 120_0 to 120_9, but ranks may be rearranged by the operation of the buffer chip 220 of FIG. 10 and ranks 0 to 2 RANK0 to RANK2 may be assigned to the memory chips MEM0 to MEM3 of all the memory packages 120_0 to 120_9.

In this case, the memory controllers 113 and 115 might not use rank 3 RANK3 (that is, the chip select signal CS<3> is always fixed to a deactivated state) and may be able to use the memory packages 120_0 to 120_9 by using only rank 0 to rank 2 RANK0 to RANK2. That is, it might not be necessary to discard the memory packages 120_0 to 120_9 as in the case of FIG. 9.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A buffer chip comprising:

a chip select signal reception circuit configured to receive system chip select signals transmitted from a memory controller;

a chip select signal mapping circuit configured to generate memory chip select signals by mapping the system chip select signals by using failed memory chip information;

a chip select signal transmission circuit configured to transmit the memory chip select signals to a plurality of memory chips;

a reset signal reception circuit configured to receive a system reset signal transferred from the memory controller;

a reset signal generation circuit configured to generate memory reset signals corresponding to the plurality of memory chips by using the failed memory chip information and the system reset signal; and a reset signal transmission circuit configured to transmit the memory reset signals to the plurality of memory chips.

2. The buffer chip of claim 1, wherein the chip select signal mapping circuit is configured to remap initial ranks of the plurality of memory chips so that at least one rank includes memory chips that are all passed memory chips when all initial ranks include at least one failed memory chip.

3. A buffer chip comprising:

a chip select signal reception circuit configured to receive system chip select signals transmitted from a memory controller;

a chip select signal mapping circuit configured to generate memory chip select signals by mapping the system chip select signals by using failed memory chip information; and a chip select signal transmission circuit configured to transmit the memory chip select signals to a plurality of memory chips, wherein the number of memory chips is N (N is an integer of 2 or more), the number of system chip select signals is N, and the number of memory chip select signals is N, wherein K number of the memory chips (K is an integer of 0 or more and less than N) are failed memory chips, and wherein the chip select signal mapping circuit is configured to fix K memory chip select signals corresponding to the K failed memory chips to a deactivated state and configured to generate remaining (N–K) memory chip select signals to have the same level as (N–K) system chip select signals, among the N system chip select signals.

4. The buffer chip of claim 1, wherein the reset signal generation circuit is configured to fix a memory reset signal corresponding to a failed memory chip, among the memory reset signals to an activated state.

5. The buffer chip of claim 1, further comprising:

a command address reception circuit configured to receive command address signals transferred from the memory controller;

a command address transmission circuit configured to transmit the command address signals to the plurality of memory chips;

an external data interface configured to transmit and receive data to and from the memory controller; and an internal data interface configured to transmit and receive the data to and from the plurality of memory chips.

6. The buffer chip of claim 5, further comprising:

a control signal transmission circuit configured to transmit the memory chip select signals generated by the chip select signal mapping circuit and the command address signals received through the command address reception circuit to the chip select signal transmission circuit and the command address transmission circuit;

a command decoder configured to decode the command address signals and the memory chip select signals;

a setting circuit configured to perform a setting operation according to a decoding result of the command decoder;

a latency control circuit configured to control an activation and a deactivation of the external data interface and the internal data interface during a write operation and a read operation;

a clock reception circuit configured to receive a clock from the memory controller;

a clock transmission circuit configured to transmit the clock received by the clock reception circuit to the plurality of memory chips; and a fail information storage circuit configured to store the failed memory chip information.

7. A memory module comprising:

a module controller including a host interface for communication with a host, a memory controller logic for memory control, and a memory interface for transmission of control signals and transmission and reception of data; and a plurality of semiconductor packages connected to the module controller, wherein each of the plurality of semiconductor packages comprises:

a buffer chip receiving the control signals from the memory interface and transmitting and receiving the data to and from the memory interface; and a plurality of memory chips receiving the control signals through the buffer chip and transmitting and receiving the data through the buffer chip, and the buffer chip comprises:

a chip select signal reception circuit configured to receive system chip select signals included in the control signals;

a chip select signal mapping circuit configured to generate memory chip select signals by mapping the system chip select signals by using failed memory chip information;

a chip select signal transmission circuit configured to transmit the memory chip select signals to a plurality of memory chips;

a reset signal reception circuit configured to receive a system reset signal transferred from the memory controller;

a reset signal generation circuit configured to generate memory reset signals corresponding to the plurality of memory chips by using the failed memory chip information and the system reset signal; and a reset signal transmission circuit configured to transmit the memory reset signals to the plurality of memory chips.

8. A memory module comprising:

a module controller including a host interface for communication with a host, a memory controller logic for memory control, and a memory interface for transmission of control signals and transmission and reception of data; and a plurality of semiconductor packages connected to the module controller, wherein each of the plurality of semiconductor packages comprises:

a buffer chip receiving the control signals from the memory interface and transmitting and receiving the data to and from the memory interface; and a plurality of memory chips receiving the control signals through the buffer chip and transmitting and receiving the data through the buffer chip, and the buffer chip comprises:

a chip select signal reception circuit configured to receive system chip select signals included in the control signals;

a chip select signal mapping circuit configured to generate memory chip select signals by mapping the system chip select signals by using failed memory chip information; and a chip select signal transmission circuit configured to transmit the memory chip select signals to a plurality of memory chips, wherein the chip select signal mapping circuit is configured to remap initial ranks of the plurality of semiconductor packages so that at least one rank includes memory chips that are all passed memory chips when all initial ranks of the plurality of semiconductor packages include at least one failed memory chip.

9. The memory module of claim 7, wherein the chip select signal mapping circuit is configured to fix a memory chip select signal corresponding to a failed memory chip among the memory chip select signals to a deactivated state.

10. The memory module of claim 9, wherein the reset signal generation circuit is configured to fix a memory reset signal corresponding to a failed memory chip among the memory reset signals to an activated state.

11. The memory module of claim 7, wherein chip select signal mapping circuits of buffer chips in the plurality of semiconductor chips are configured to perform the mapping operation so that memory chips corresponding to the same system chip select signal in all the semiconductor packages are processed to be failed memory chips.

12. A semiconductor package comprising:

a package substrate including a plurality of terminals to communicate with a memory controller and a plurality of bonding pads to communicate inside a package;

a buffer chip stacked on the package substrate;

a plurality of memory chips stacked on the buffer chip; and a plurality of wires connecting the plurality of bonding pads and the plurality of memory chips, wherein the buffer chip communicates with the memory controller through the plurality of terminals of the package substrate, the plurality of memory chips communicate with the buffer chip through the plurality of wires and the plurality of bonding pads of the package substrate, and the buffer chip comprises:

a chip select signal reception circuit configured to receive system chip select signals transmitted from a memory controller;

a chip select signal mapping circuit configured to generate memory chip select signals by mapping the system chip select signals by using failed memory chip information; and a chip select signal transmission circuit configured to transmit the memory chip select signals to a plurality of memory chips.

13. The semiconductor package of claim 12, wherein the buffer chip further comprises:

a reset signal reception circuit configured to receive a system reset signal transferred from the memory controller;

a reset signal generation circuit configured to generate memory reset signals corresponding to the plurality of memory chips by using the failed memory chip information and the system reset signal; and a reset signal transmission circuit configured to transmit the memory reset signals to the plurality of memory chips.

14. The semiconductor package of claim 12, wherein the chip select signal mapping circuit is configured to remap initial ranks of the plurality of memory chips so that at least one rank includes memory chips that are all passed memory chips when all initial ranks include at least one failed memory chip.

15. The semiconductor package of claim 12, wherein the number of memory chips is N (N is an integer of 2 or more), the number of system chip select signals is N, the number of memory chip select signals is N, K of the memory chips (K is an integer of 0 or more and less than N) are failed memory chips, and wherein the chip select signal mapping circuit is configured to fix K memory chip select signals corresponding to the K failed memory chips to a deactivated state, and generates remaining (N–K) memory chip select signals to have the same level as (N–K) system chip select signals among the N system chip select signals.

16. The semiconductor package of claim 13, wherein the reset signal generation circuit is configured to fix a memory reset signal corresponding to a failed memory chip among the memory reset signals to an activated state.

17. The semiconductor package of claim 15, wherein the buffer chip further comprises:

a command address reception circuit configured to receive command address signals transferred from the memory controller;

a command address transmission circuit configured to transmit the command address signals to the plurality of memory chips;

an external data interface configured to transmit and receive data to and from the memory controller; and an internal data interface configured to transmit and receive the data to and from the plurality of memory chips.

18. The semiconductor package of claim 17, wherein the buffer chip further comprises:

a control signal transmission circuit configured to transmit the memory chip select signals generated by the chip select signal mapping circuit and the command address signals received through the command address reception circuit to the chip select signal transmission circuit and the command address transmission circuit;

a command decoder configured to decode the command address signals and the memory chip select signals;

a setting circuit configured to perform a setting operation according to a decoding result of the command decoder;

a latency control circuit configured to control activation and deactivation of the external data interface and the internal data interface during a write operation and a read operation;

a clock reception circuit configured to receive a clock from the memory controller;

a clock transmission circuit configured to transmit the clock received by the clock reception circuit to the plurality of memory chips; and a fail information storage circuit configured to store the failed memory chip information.

* * * * *